United States Patent [19]

Peil et al.

[11] 4,388,536
[45] Jun. 14, 1983

[54] PULSE GENERATOR FOR IC FABRICATION

[75] Inventors: William Peil, North Syracuse; Thomas A. Brown, Fulton; Marc A. Dissosway, Liverpool, all of N.Y.

[73] Assignee: General Electric Company, Syracuse, N.Y.

[21] Appl. No.: 390,359

[22] Filed: Jun. 21, 1982

[51] Int. Cl.³ .............................................. H03K 5/08
[52] U.S. Cl. ...................................... 307/268; 328/34
[58] Field of Search .................... 328/34, 59; 307/228, 307/260, 268

[56] References Cited

U.S. PATENT DOCUMENTS

| | | | |
|---|---|---|---|
| 2,702,853 | 2/1955 | Watson | 328/34 X |
| 2,797,317 | 6/1957 | Leeds | 328/59 |
| 2,834,880 | 5/1958 | Clapper | 328/34 |
| 2,872,576 | 2/1959 | Brumbaugh et al. | 328/59 X |

3,215,855  11/1965  Cole et al. ......................... 307/268

Primary Examiner—Donald A. Griffin
Attorney, Agent, or Firm—Richard V. Lang; Carl W. Baker

[57] ABSTRACT

The present invention relates to a pulse generator for use at a selected frequency near 100 Khz and having a predetermined duty cycle (typically 20%). The pulse generator is designed for integrated circuit fabrication using a CMOS process. The design utilizes a ring oscillator whose frequency is varied by external adjustment of a single resistance and which utilizes a gating stage responsive to electrical conditions in at least two stages of the ring oscillator to establish the desired duty cycle. The duty cycle may also be adjusted, as by the inclusion of optional stages in the ring oscillator. The design features a low power consumption, and high temperature stability of frequency and duty cycle.

16 Claims, 10 Drawing Figures 0.4 μS/SMALL DIV
2 μS/LARGE DIV (FIG. 1B EMBODIMENT)

D6 WAVEFORM (UNCORRECTED TIME)

0.4 μS/SMALL DIV
2 μS/LARGE DIV

FIVE STAGE RING OSCILLATOR
FREQUENCY AND DUTY CYCLE VS. SUPPLY CURRENT

FIVE STAGE RING OSCILLATOR
FREQUENCY AND DUTY CYCLE VS. SUPPLY CURRENT

FIVE STAGE RING OSCILLATOR
FREQUENCY AND DUTY CYCLE VS. CONDUCTIVITY

FIVE STAGE RING OSCILLATOR
FREQUENCY AND DUTY CYCLE VS. Vdd

FIVE STAGE RING OSCILLATOR
FREQUENCY AND DUTY CYCLE VS. TEMPERATURE

PULSE GENERATOR FOR IC FABRICATION

BACKGROUND OF THE INVENTION

1. Field of the Invention

The present invention relates to pulse generators and more particularly to pulse generators having a predetermined frequency and duty cycle, such as are capable of integrated circuit fabrication. The invention further relates to low current circuitry employing complementary metal oxide semiconductor (CMOS) field effect transistor technology.

2. Description of the Prior Art

The need has arisen for a pulse generator formed on an integrated circuit having a low current drain, a controllable frequency and a selected duty cycle. The frequency should be controllable externally to the integrated circuit with a minimum component count and a minimum pad count. The application also requires that the frequency and duty cycle have a high degree of temperature stability.

In the practical application envisioned for the invention, the desired center frequency is 100 Khz with an at least 3 to 1 range of possible adjustment (60-180 Khz). The desired duty cycle is near 20% temperature stability of frequency and duty cycle over a wide temperature range (typically 20°-125° C.) is also sought.

It is known that a ring oscillator can be readily fabricated using CMOS technology. In the known example, the oscillator is not a part of the working circuit, but is used to test the process by which the working circuit is formed on the integrated circuit. Typically it includes as many as 19 stages, since the power and chip area requirements are small. The present invention makes an adaptation of the ring oscillator approach in the provision of a pulse generator having the desired performance characteristics.

SUMMARY OF THE INVENTION

Accordingly, it is an object of the invention to provide an improved pulse generator for integrated circuit fabrication.

It is another object of the invention to provide an improved pulse generator for integrated circuit fabrication, in which the frequency may be readily selected.

It is a further object of the invention to provide an improved pulse generator for integrated circuit fabrication having a desired duty cycle.

It is still another object of the invention to provide an improved pulse generator for integrated circuit fabrication of low current drain.

An additional object of the invention is to provide an improved pulse generator for circuit fabrication, in which both frequency and duty cycle are stable over a wide temperature variation.

These and other objects of the invention are achieved in a novel pulse generator for integrated circuit fabrication, having a predetermined frequency and duty cycle. In the pulse generator, a positive terminal for connection to a source of bias potentials and a common terminal are provided. The pulse generator includes a ring oscillator comprising an odd number of complementary metal oxide semi-conductor (CMOS) field effect transistor inverter stages. Each stage includes a p-channel device, having the source connected to the positive terminal, and an n-channel device having the drain connected to the drain of the associated p-device. The drain connection forms an output of that stage. The gates of the p and n-devices of each stage are connected together. The gate node forms an input of that stage. The input of each stage is connected to the output of the preceeding stage so as to form a ring.

In addition, the sources of the n-devices are connected together; and a resistance of a preselected value is provided connecting the source connection to the common terminal. The value chosen for the resistance determines the oscillator frequency and to a lesser extent, the duty cycle.

In addition, gating means responsive to electrical conditions in at least two stages of the ring oscillator are provided for generating an output pulse having the desired duty cycle. The gating means has one or two thresholds.

In a first embodiment, the output pulse is initiated when an input crosses a threshold value in one sense and the output pulse is terminated when an input crosses a threshold value in the opposite sense. More particularly the gating means is responsive to the difference between a first voltage at the gate of the (i)th inverter stage and a second voltage at the gate of the (j)th inverter stage. A change in the first gate voltage, while the second gate voltage is substantially constant, establishes one limit of the output pulse, and a change in the second gate voltage, while the first voltage is substantially constant, establishes the other limit of the output pulse. In this embodiment, "i" and "j" represent adjacent inverter stages, listed in succession.

The circuit of the gating means in the first embodiment, comprises a CMOS stage including a p-channel device and an n-channel device current sink. The gating p-device has the drain thereof connected to the drain of the current sink device. The source of the current sink device is connected to ground and the gate is connected to the positive terminal. The source of the gating p-device is connected to the gate node of the (i)th inverter stage, and the gate of the gating p-device is connected to the gate node of the (j)th inverter stage. The gating output is taken from the drain interconnection of the gating means.

In accordance with another facet of the invention, means are provided for enabling the oscillator, comprising an n-device inserted in a series path between the sources of the oscillator n-devices and the resistance, the gate being connected to a source of control potentials.

In addition, the substrates of all of the n-devices in the ring oscillator are connected to ground to provide a body effect which increases the voltage swing on the output-input connections of the ring oscillator stages.

The ring oscillator is fabricated in an integrated circuit while the resistance is an external component. This permits oscillator frequency selection after fabrication of the integrated circuit by selection of desired value of resistance. In addition, the integrated circuit may be provided with an optional number of additional stages to the ring oscillator to permit duty cycle variation after diffusion of the devices on the IC by use of one of two optional metallizations. One optional metallization connects the additional stages into the ring oscillator circuit while the other disconnects the additional stages from the ring oscillator circuit.

The pulse generator is completed by a buffer, which may take the form of a CMOS amplifier stage or a hysteresis gate.

In a second embodiment, which permits smaller devices in the ring oscillator, the gating means includes a first and a second threshold amplifier, one connected to the gate of the (i)th inverter stage, and initiating an output pulse when the signal at the (i)th gate crosses a threshold value; and the other connected to the gate of the (j)th inverter stage, and terminating the output pulse when the signal at the (j)th gate crosses a threshold value. The characters "i" and "j" are listed in succession, j representing the (i+2n)th stage of the m stage ring oscillator, n being an integer (usually 1) permitted within the total stage count m.

Each threshold amplifier comprises a p-channel device and an n-channel device current sink. The gate of the p-channel device is connected to the gate node of the appropriate ((i)th or (j)th) inverter stage. The p-channel device has the drain thereof connected to the drain of the associated n-channel device, and the source of the n-channel device is connected to ground. The gating output of threshold amplifier is taken from the drain interconnection.

In accordance with another aspect of the second embodiment, the conductive connection of the sources of the p-channel devices of the oscillator inverter stages to the positive terminal, is provided by a diode. Since the sources of the threshold p-channel devices are connected to the positive terminal, the gate to source potentials of the threshold amplifiers are increased, and their level of conduction is enhanced for a given level of oscillation.

An output stage is also provided comprising a p-channel device and an n-channel device. The source of the output p-channel device is connected to the drain of the threshold p-channel device coupled to the (i)th inverter stage. The gates of the output p-channel and n-channel devices are connected to the drain of the threshold p-channel device coupled to the (j)th inverter stage. The source of the output n-channel device is connected to the common terminal. A substantially rectangular output pulse is derived from the interconnected drains of the output p-channel and n-channel devices.

BRIEF DESCRIPTION OF THE DRAWINGS

The novel and distinctive features of the invention are set forth in the claims of the present application. The invention itself, however, together with further objects and advantages thereof, may best be understood by reference to the following description and accompanying drawings in which:

DESCRIPTION OF THE PREFERRED EMBODIMENTS

Figure 1:
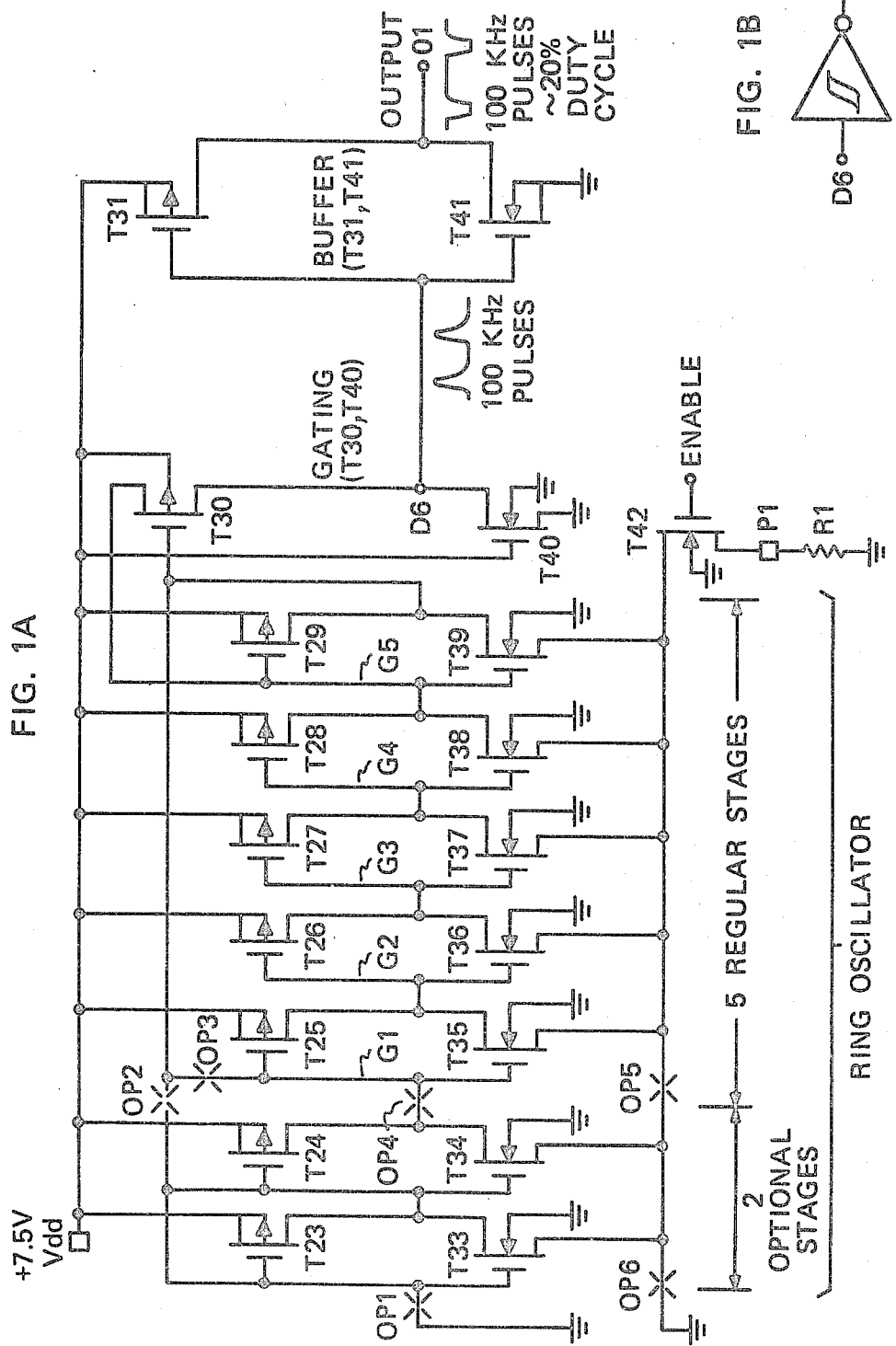
FIG. 1(a) is an electrical circuit diagram of a first embodiment of a novel pulse generator for integrated circuit fabrication, featuring a non-50% duty cycle, and including a ring oscillator with optionally 5 or 7 stages, a gating stage and an output buffer.
FIG. 1(b) is a modification of the FIG. 1(a) embodiment using a hysteresis gate instead of the output buffer.

Referring now to FIG. 1(a), there if shown a novel pulse generator formed as an integrated circuit, and producing a waveform having time asymmetry (a 20% duty cycle) and having a controllable frequency which may be set by means external to the integrated circuit. The pulse generator comprises a ring oscillator of optionally five (T25-T29; T35-T39) or seven stages (T23-T29; T33-T39), an enable stage (T42) which enables or disables the ring oscillator, a gating stage (T30, T40), which is responsive to electrical conditions on the ring oscillator to obtain a pulsed waveform from which the desired duty cycle may be derived, and an output buffer stage (T31, T41) which produces the output waveform with the desired duty cycle in a more nearly rectangular format. The buffer output is substantially isolated from the ring oscillator and gating stage. A resistance R1 external to the IC is provided for establishing the repetition rate or frequency of the output waveform.

The pulse generator will now be described assuming that the ring oscillator is connected for five-stage operation and that the two optional stages are dormant. Under these circumstances, the optional connections OP1, OP3 and OP6 are closed; and the optional connections OP2, OP4 and OP5 are left open. As illustrated, the ring oscillator is an odd numbered (e.g., 5, 7) succession of inverting complementary field effect transistor stages. Each stage includes a p-channel device (T25-T29) and each stage includes an n-channel device (T35-T39).

More particularly, the devices are illustrated by a long vertical line representing the channel and two short horizontal lines near the upper and lower ends of the "channel" representing the source and drain electrodes. An arrow drawn between the electrodes points away from the channel when the device is a p-channel device (n-conductivity material in the channel) and into the channel when the device is an n-channel device (p-conductivity material in the channel). The short vertical line to the left of the channel represents the insulated gate and is the input or control electrode of the device.

In a p-channel device, both source and drain are small P+ diffusions in an n-doped substrate to which electrodes are applied. Since the source and drain may be reversed by reversing the bias connection, it is conventional to refer in a p-channel device to the most positively biased contact as the "source", while the less positively biased contact is referred to as the "drain". Conduction between source and drain arises by the inducement in the n material of a p-channel immediately under the insulating gate. Conduction occurs when the gate goes negative in respect to the source by an amount in excess of a device threshold, which allows conduction by the creation of majority carriers (positive holes) between the source and drain electrodes. This is called "enhancement mode" operation.

The n-channel devices are formed in a larger P well which contains two electroded N+ regions, providing the source and drain respectively and spaced apart so that an insulated gate may be applied over the region between the two diffusions. As in the case of the p-channel device, the electrodes of an n-channel device may also be reversed. The source electrode is defined as the most negatively biased and the drain as the less negatively biased electrode. The n-channel device is turned on by the application of a positive potential to the gate which induces majority charges (electrons) in the n-channel. Conduction occurs when the positive potential applied to the gate, measured in respect to the source, exceeds the device threshold.

In the complementary MOSFET configuration herein described, each inverting stage (e.g., T25, T35) includes a p-channel device (T25) and an n-channel device (T35). The source and substrate of the p-channel device are connected to the +7.5 volt Vdd bias line, while the drain of the p-channel device is connected to the drain of the n-channel device. As illustrated, the substrate of the n-channel device is connected to ground on the integrated circuit, while the source is connected via an enable gate (T42) and an external resistance R1 to ground (as will be more fully described below). The gates of the two transistors T25 and T35 are connected together and form the input of the stage. The drains of the two transistors are connected together and form the output of the stage.

Each stage operates as an inverter. Assuming that the gates are at a low potential (i.e., Vgs (gate to source potention) near zero), the enable gate (42) is conductive, connecting the n-device sources to ground via the external resistor R1, the n-device is off and the p-device is on, making the output high (near Vdd). Assuming that the gates are at a high potential (near Vdd), the n-device is on, and the p-device is off, and the output is at a low potential. Assuming that the gates of a stage are at an intermediate potential and switching off, the drains are at an intermediate potential with both devices conducting and switching on.

Considering the ring oscillator as a whole; the output drains of the stage (T25, T35) are connected to the input gates of the following stage (T26, T36) the output drains of which are reconnected back to the input gates of the initial stage (T25, T35). All sources of the n-devices (T35, T39) are connected to the drain of the enable transistor T42, an n-channel device. The substrate of T42 is connected to ground and the source is connected to the pad P1 at the margin of the integrated circuit. The pad P1 is connected by the external resistance R1 to an off-the-chip ground. The "off-the-chip ground" is electrically connected in common with the substrate grounds shown on the integrated circuit.

Assuming that the enable stage (T42) is on, the source of the n-devices are connected to ground via the external resistor R1, and the ring oscillator is enabled to operate. The input-output connections so far described form a ring, from which the oscillator draws its name. Assuming that the operation proceeds with the requisite gain, each stage will turn the succeeding stage to an opposite state, and the process will continue to the last stage of the ring, and then start over again with the first stage of the ring.

The frequency of the oscillations of the ring oscillator and likewise the pulse generator is a function of the amount of time that it takes each stage to invert and then reinvert, and the number of stages. Assuming that the gates at node G1 are low, and begin to increase toward the B+ potential, the p-device T25 is highly conductive and the n-device T35 is nearly nonconductive. The drains of T25, T35 are connected to the gates of T26, T36, with T26 nearly nonconductive and T36 highly conductive. In this state, there is negligible induced charge in the p-channel under the gate of T26 (since both substrate and gate are near B+ potential) and there is an induced positive charge in the n-channel under the gate of n-device T36. The p-device T25 is enabled but is conducting little current since the n-device T36 has an insulated gate. Assuming the n-device T36 is turning on, current is drawn from the gate of T26 (causing it to charge) and from the gate of T36 (causing it to discharge). The process of charging and discharging the two gates takes a controlled amount of time, and the rates of charge and discharge are dependent on the capacitance of the gates and the amount of current provided. During this inversion, the switching rate is also dependent on the resistance R1, and on the Vdd potential. The effect of n-channel conductance and transconductance is negligible.

In the alternate state, with T25 nearly nonconductive and T35 highly conductive, a different time is required to change the state of the stage. As a result of the above assumptions, T26 is highly conductive and T36 nearly nonconductive and the potential on the gates of T25, T35 is decreasing in the direction to turn on T25 and turn off T35. At the starting instant, the gate of T26 has a charge since the gate is low and the substrate is at B+ potential, and the gate of T36 has negligible charge since the gate is low, and the substrate (the P well) is near ground potential. Transistor T35 is enabled but drawing negligible current since T25 is nearly nonconductive and the gates of T26 and T36 are insulated. As T25 begins to conduct, it begins to discharge the gate of T26 and to charge the gate of T36 to the B+ Bus. The process of charging and discharging the gates takes a controlled amount of time. Here, the rates of charge and discharge are again dependent on the capacitance of the gates and the amount of current provided. During this inversion, the switching rate is primarily dependent on the p-channel conductance and transconductance, but is also dependent to a lesser degree on R1. The two rates of inversion will be different, with the first requiring more time due to the asymmetry of the conductivities resulting from serial resistance R1. A range of frequency adjustment greater than 3 to 1 with variation of R1 is practical.

The foregoing, simplified discussion, approximately describes the waveforms that may be observed in the ring oscillator and the frequency control mechanism. When the loop is closed, the same waveform will generally appear at the input of each stage, and will progress through to the last stage, and then return to the first stage and repeat. Based on a breadboard version of the IC, running at 100 Khz, the average value of the waveform is balanced at approximately 2 volts below the Vdd voltage, and swings toward ground and toward Vdd. The magnitude of the voltage swings in this practical embodiment is about 5 volts with 7.5 V Vdd. If the devices have greater gain, the voltage swing will be somewhat larger, and if they have less gain, the voltage swing will be somewhat smaller. The devices in each stage handle very low currents and a load provided to any stage will significantly affect the operating limits of that stage.

Since each stage of a five-stage ring oscillator of a pulse generator is operating through a similar switching sequence, a sensor arranged to sense a waveform in the same stage of the ring oscillator might be expected to detect equal (i.e., $\frac{1}{2}-\frac{1}{2}$) intervals while the sensor sensing waveforms in successive stages of the ring oscillator, might be expected to detect unequal (i.e., 1/5-4/5; 1/7-6/7) intervals. The gating stage (T30-T40) cooperates with the ring oscillator and provides the timing function for the pulse generator. It senses two successive waveforms (G5, G1) and produces a pulse output waveform having an approximately 20% duty cycle in the principal embodiment.

The gating stage (T30, T40) of the pulse generator is connected as follows: T30 is a p-channel device having its source connected to the gate connection G5 of the fifth stage (T29, T39) which is also the output drain connection of the fourth stage (T28, T38). The drain of T30 is connected to the drain of the n-device T40. The substrate of T30 is connected to the Vdd bus. The substrate and source of T40 are connected to ground. The gate of T30 is connected to the output drain of the fifth stage (T29, T39) and also to the gate connection G1 of the first stage (T25, T35). The gate of T40 is connected to the Vdd Bus. The gating output is a waveform having approximately the desired 20% duty cycle. It appears at the drains of T30, T40.

The conduction interval of the gating stage (T30, T40), and therefore the output voltage at drain connection D6, neglecting loading, parasitics, and the altering body effects of T30 is primarily a function of the difference in voltage applied between the gate and the source of T30. To a lesser degree the D6 waveform, represents a loading by the gating stage of the stages of the oscillator, new charging and discharging paths for the parasitic capacitors of the oscillator, and a change in body effect, as the source of T30 falls below Vdd at which the substrate of T30 is maintained. Thus to a lesser degree the output waveform is a function of the state of conduction of oscillator stage (T29, T39), the state of conduction of T40 connected between D6 and ground, and the state of conduction of T30 and T28 of oscillator stage (T28, T38), which are serially connected between D6 and the Vdd Bus. (This last current path may be traced from D6 via the drain of T30, source of T30, the G5 gate node, the drain of T28, and the source of T28, to the Vdd Bus.)

Figure 3A:
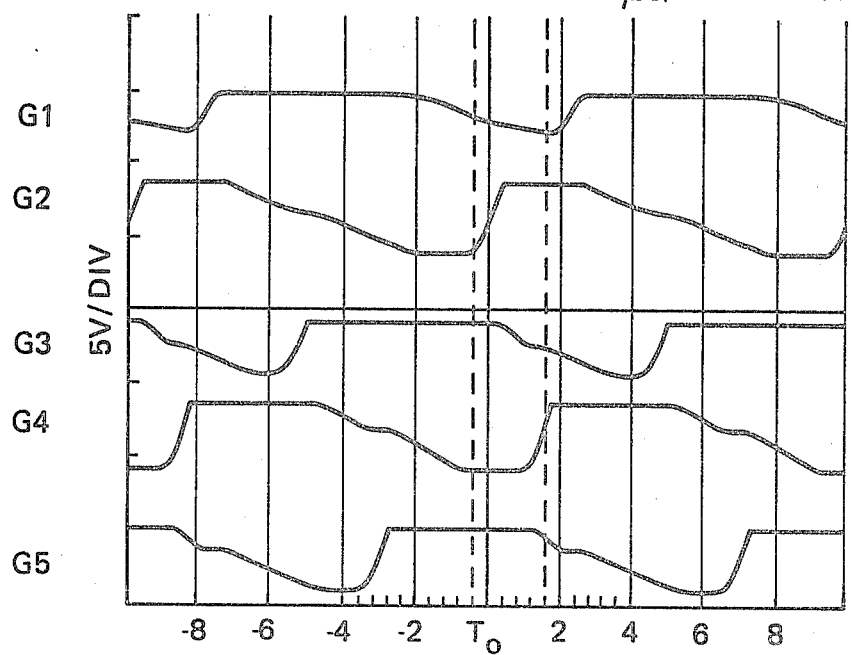
FIG. 3(a) illustrates the voltage waveforms at the gates of individual stages in the ring oscillator of the FIG. 1 embodiment.
Figure 3B:
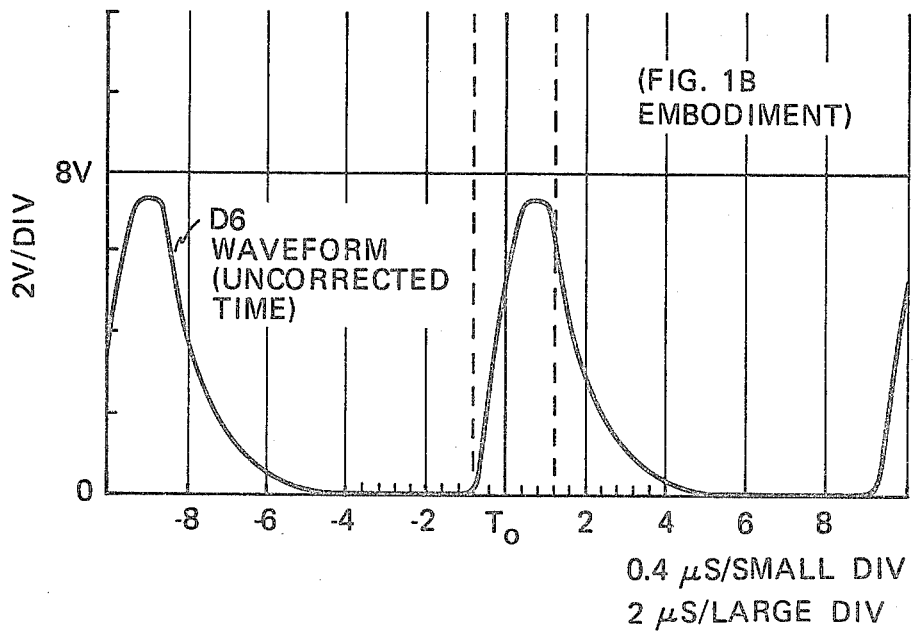
FIG. 3(b) illustrates a low duty cycle waveform as it appears at the output of the gating stage, prior to application to the output buffer.

Examination of the waveforms of FIGS. 3(a) and 3(b) provides a more detailed explanation of ring oscillator operation and how a specific duty cycle for the pulse output is achieved. The waveforms in FIG. 3 are oscilloscope waveforms made at the gate connection G1, G2, G3, G4 and G5, respectively of the ring oscillator. FIG. 3(a) uses the vertical scale of 5 V per division. The waveforms of FIG. 3(a) represent successive inversions along the oscillator ring. The waveform at G1 is approximately one-half the amplitude of the other waveforms (G2-G5) due to the loading of the gating stage T30, T40.

The waveform of FIG. 3(b) is also two periods of a waveform that appears at the drain node D6 of the gating stage (T30-T40). The horizontal scale is $2\mu$ seconds per division and the vertical scale is 2 V per division. The FIG. 3(b) waveform is displaced to the left of the FIG. 2(a) waveforms by approximately one small division (0.4$\mu$ seconds).

The gating stage derives a waveform having an approximately 20% duty cycle in the following manner. The waveforms of FIGS. 3(a) and 3(b) are useful in following the explanation. Transistor T40 is a low current device of which the gate is always enabled, which means that the drain of T40 is at a low (near ground) potential, when T30 is not conducting; although it may be at a high (near Vdd) potential when T30 is conducting.

Initially, one may assume the drains of (T29, T39) (G1) have begun to fall from Vdd and that the drains (T28, T38) (G5) are near Vdd. When G1 falls to approximately 1.5 volts below Vdd, T30 whose source is maintained near Vdd by connection to G5 will become conductive, initiating the D6 output pulse. As the cycle progresses, the G5 output of stage (T28, T38) nears the high (Vdd) state and begins to decay slowly from Vdd. Thus the source of T30 assumes a less positive voltage than the substrate, and the body effect causes a reduction in the turn on threshold of T30. When the voltage on G5 has fallen far enough in relation to the voltage on G1 to exceed the lowered threshold, T30 will turn off, and the D6 waveform will fall from the peak value. Since T30 loads the oscillator, the initial downward slope of the D6 waveform is partly due to the fact that the conductivity of T28 has slightly earlier begun to fall while G4 was rising. The relatively steep downward slope of the D6 waveform is primarily due to T40, with T30 "off".

The output of the gating stage is the current leaving the drain of T30 flowing through T40 ground. Transistor T40 converts this current waveform to a voltage pulse waveform to be derived from the buffer stage, which is the last element of the pulse generator. The buffer stage is shown at (T31, T41). It is an additional CMOS stage comprising a p-channel device T31 and an n-channel device T41. The source and substrate of T31 are connected to the Vdd Bus, while the drain of T31 is connected to the drain of T41. The substrate and source of T41 are connected to ground. The gates of T31, T41 are connected to the output D6 of the gate. The output of the buffer, which is of inverted polarity to that appearing at the input, and more rectangular, appears at the drains of terminainal 01.

FIG. 1(b) illustrates a hysteresis gate as an alternative to the buffer (T31, T41). The hysteresis gate may be connected between the D6 output of the gating stage and the 01 output of the pulse generator. The hysteresis gate may be a Schmitt Trigger of the same design as used in the RCA 40106. The Schmitt Trigger has different turn-on and turn-off threshold, and avoids simultaneous conduction while producing a nearly instantaneous change in output states. The Schmitt Trigger decreases the power drain over that of a simple buffer, an advantage which in certain applications outweighs its greater complexity.

As implied earlier, the current drawn by T28 and the gate capacity of T30 will upset the symmetry of the oscillator ring. The driving devices can be scaled to minimize or substantially eliminate the effect or one may make the device T30 of minimum size.

The operation of the pulse generator may be treated with greater detail in the timing particulars. The waveform G1 represents the voltage on the G1 node of the ring oscillator. All the following timing is approximate. At 0.4 $\mu$S before $T_o$ (the central vertical coordinate axis), the gate voltage at G1 has slowly fallen to approximately 1.5 volts below maximum initiating the turn-on of T25 and turn-off of T35. At that instant (0.4 $\mu$S before $T_o$) the voltage at G2 begins to rise, which occurs rapidly. As G2 increases to 1.5 volts below maximum (0.4 $\mu$S after $T_o$), T36 shuts off and T26 turns on. This affects the voltage on G3. The waveform G1 continues downward until it reaches its minimum value. At a time 2.0 $\mu$S after $T_o$), the G1 waveform begins to rise (rapidly). As G1 reaches 1.5 volts below maximum, T25 is turned off and T35 is turned on. At 2.4 $\mu$S after $T_o$, the gate voltage at G2 begins to decline slowly. At 4 $\mu$S after $T_o$, G2 has slowly declined 1.5 volts below maximum, causing T26 to turn on and T36 to turn off, again affecting G3. Thus the waveform G2 starts to increase from the minimum value when G1 has fallen through 1.5 volts below maximum and the waveform G2 starts to decrease from the maximum value when G1 has increased through 1.5 volts below maximum.

Similarly, the waveform G3 starts to increase from the minimum value when the waveform G2 has fallen through 1.5 volts below maximum, and the waveform G3 starts to decrease from the maximum value when the waveform G2 has increased through 1.5 volts below maximum. Similarly, the waveform G4 starts to increase from the minimum when the waveform G3 has fallen through 1.5 volts below maximum, and G4 starts to decrease from the maximum when the waveform G3 has increased through 1.5 volts below maximum. Similarly, the waveform G5 starts to increase from the minimum when the waveform G4 has fallen through 1.5 volts below maximum, and G5 starts to decrease from the maximum when the waveform G4 has increased through 1.5 volts below maximum. Finally, the G5 waveform, by virtue of the ring connection of (T29, T39) to G1, produces the turning points in the waveform G1, already assumed. Each oscillator waveform in FIG. 3(a) clearly shows that the voltage drop is slow and the voltage rise is fast.

This now permits one to draw conclusions as to the parameters affecting the frequency. The frequency of the ring oscillator is controlled by the rate at which the gate capacitance of each device is charged and discharged between Vdd and the switching threshold (i.e., 1.5 volts below Vdd). During the rapid voltage rise the external resistance (R1) has a small effect while the p-channel device conductance and transconductance limits the rate at which the voltage rise occurs. Since the FET device turn-on occurs by the changing gate voltage, the concerned parameter is the transconductance as well as the conductance of the FET. During the slower voltage fall, the external resistance (R1) is in the circuit path, and decreases the rate at which the voltage falls. Consequently, if R1 is increased the frequency will decrease.

FIGS. 4-8 illustrate the effect of certain parameters upon operation of the pulse generator. The data of these figures was taken from a breadboard version of the FIG. 1(b) embodiment in which the current sink T40 was replaced by a 62 K ohm resistor, and a Schmitt Trigger inverter was employed.

Figure 4:
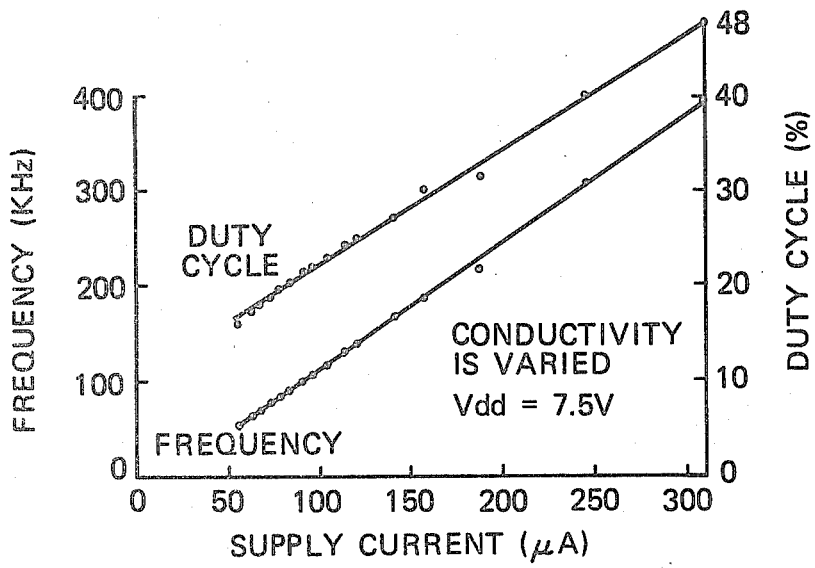
FIGS. 4, 5, 6, 7 and 8 are preformance curves of the FIG. 1(b) embodiment, bread-boarded, using discrete devices.

FIG. 4 is a plot of the effect on frequency and duty cycle of resistance variation. The horizontal coordinate is the supply current in microamperes of the pulse generator and the vertical coordinates are the frequency and duty cycle. It is assumed that the Vdd voltage is held constant at 7.5 volts. The graph illustrates a substantially linear dependence of frequency and duty cycle on current drain.

Figure 5:
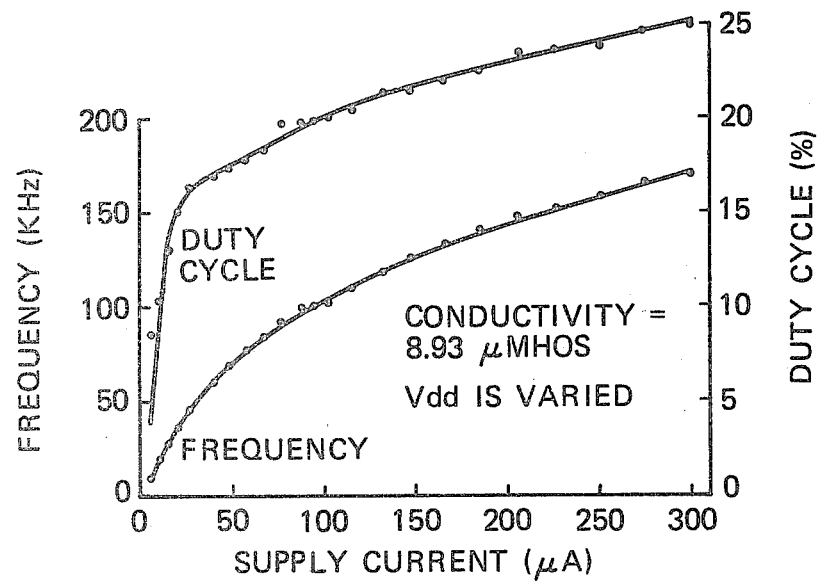

FIG. 5 is a second graph illustrating the effect of supply current in microamperes (horizontal coordinate) upon frequency and duty cycle (vertical coordinates). This graph assumes that the resistance is held constant and that the Vdd voltage is varied. FIGS. 4 and 5 lead to the conclusion that the current (and thus the frequency) may be controlled either by an adjustment of Vdd or the value of R1.

Figure 6:
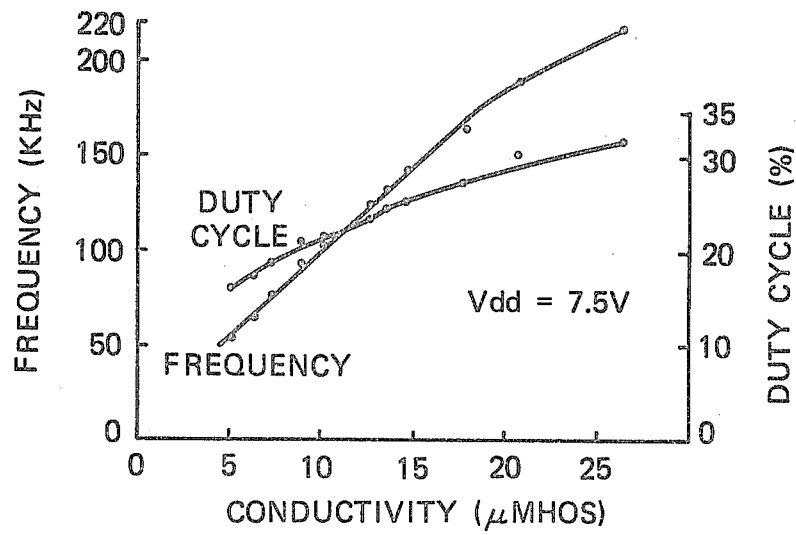
Figure 7:
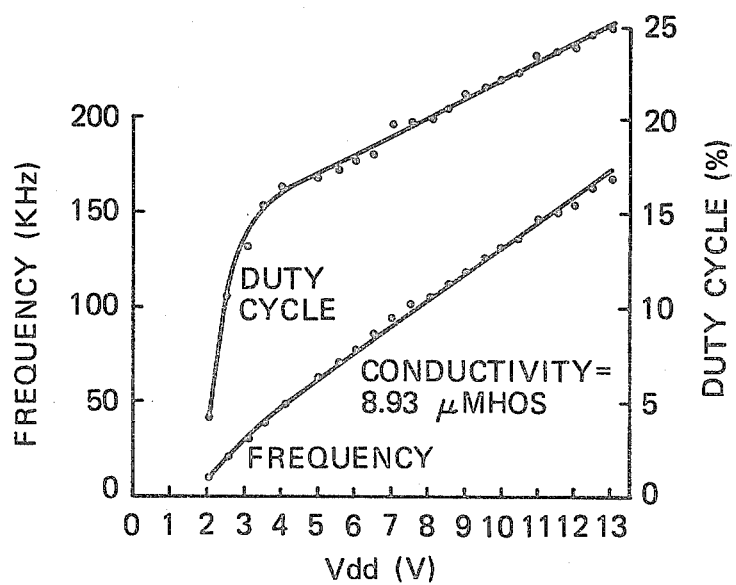

FIG. 6 illustrates the dependence of frequency and duty cycle upon conductance of T1. FIG. 7 illustrates the dependence of frequency and duty cycle of the Vdd voltage.

Figure 8:
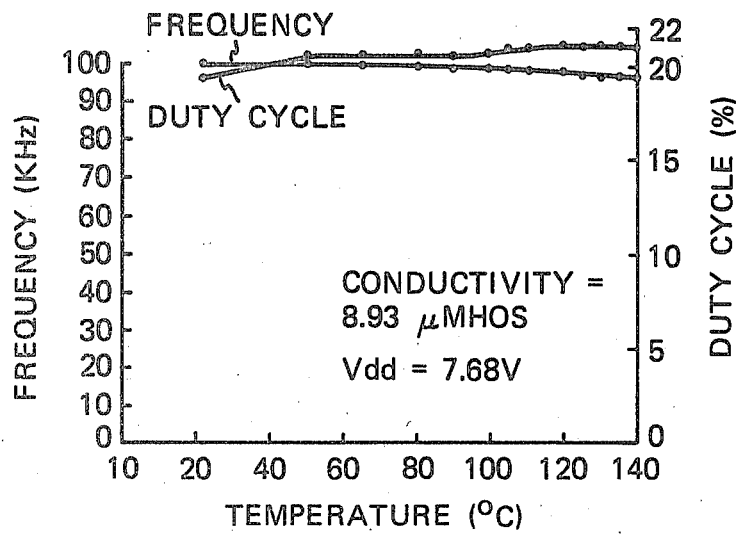

FIG. 8 illustrates the degree of temperature stability of both the frequency and the duty cycle. More particularly, with 120° C. range in temperature, the frequency drop is approixmately 7% (100.5 Khz to 93.5 Khz) and the duty cycle variation is about 9.5% (19.2% to 21.0%) through the same temperature range.

The timing of the D6 waveform of the gating stage of the pulse generator, is based primarily on the timing of the waveforms G5 and G1 of the ring oscillator and secondarily on the G4 waveform. The D6 waveform is at zero (the normal state) and starts to increase to Vdd potential at the instant that the potential on G1 falls to approximately 1.5 volts below the maximum voltage. This occurs at about $0.4\mu$ seconds (D6 corrected) to the left of central time division $T_o$ in FIG. 3(b). Meanwhile, the gate connection G5 is near the Vdd voltage and so continues for an interval starting at approximately $2.8\mu$ seconds earlier than $T_o$ and terminating $1.2+\mu$ seconds after $T_o$. The G5 waveform drops slowly, starting at $1.2\mu$ seconds after $T_o$. Due to the increased body effect as the source voltage (G5) of T30 falls below Vdd, G1 remaining substantially constant as it approaches its minimum value, the turn-off threshold of T30 is reduced. At an instant near $1.6\mu$ seconds after $T_o$ the lowered threshold is crossed and T30 begins to turn off, starting the turn-off of the D6 waveform. Meanwhile the gate G4 waveform which has been low since $0.8\mu$ seconds before $T_o$ begins a rapid increase toward Vdd, at about $1.2\mu$ seconds after $T_o$, commencing the turn-off of T30. The turn-off of T30 hastens the decay of the output waveform (D6) to its zero condition. The waveform is asymmetric, climbing more steeply than it falls.

The asymmetry of the D6 waveform is attributable to the difference in conductivity of T30 and T40 and to a lesser degree to the other circuit elements. If T40 is of much lower conductance than T30, and both T30 and T40 are substantially smaller than the devices in the stages of the ring oscillator (T28, T38 in particular) then the difference in slope will occur, with T40 establishing the slower fall time and T30 establishing the faster rise time. It is preferable in the interests of tolerating processing variations, to make the buffer switching operation less dependent on buffer threshold, i.e., make the switching operation dynamic rather than static.

The buffer stage (T31, T41) of the pulse generator also uses smaller devices than the oscillator, and produces an output waveform with steeper sides and a duty cycle close to but 1 to 2% larger than that of the D6 waveform. The output waveform of the buffer (and therefore the pulse generator) is illustrated at the output terminal 01. The buffer in which the source and substrate of T41 are connected to ground, operates symmetrically with respect to ground and Vdd. If D6 is less than 1.5 volts above ground, T31 will be turned on and T41 will be turned off. If D6 is more than 6.0 volts above ground, T31 is turned off and T41 turned on. In the region between +1.5 volts and +6.0 volts, both T31 and T41 are conducting and will produce an output waveform whose width corresponds approximately to the width of the input waveform (D6) at 3.75 volts, the midpoint of the voltage swing. If the waveform D6 is applied to a hysteresis gate, the voltage may be higher (e.g., 4.5 V) on the rising portion of the waveform and lower (e.g., 3 V) on the falling portion of this waveform. There will be no simultaneous conduction and output switching will be very sharp, drawing minimal supply current.

The FIG. 1(a) embodiment of the pulse generator contains two stages which may be optionally connected into the ring oscillator circuit to decrease the duty cycle to about 15%. These stages consist of the first stage T23, T33 and a second stage T24, T34 which are in all respects like the stages of the 5-stage ring oscillator. In order to permit either 5-stage or 7-stage operation, optional connections (OP1, OP2, OP3, OP4, OP5 and OP6) are provided. In normal 5-stage operation, OP1 provides a closed connection grounding the gates of T23 and T33, disabling that stage and holding T24, T34 in a fixed condition. At the same time OP2, OP4 and OP5 are held open and OP6 is held closed disconnecting the two optional stages. In addition, OP3 is closed, connecting the output of the last counter stage back to G1. In 7-stage operation, the options are all set oppositely. At OP1, the gates of T23 and T33 are isolated from ground and OP2 is closed, while OP3 is closed. OP2 and 3 close the ring by connecting the output of the last stage (T29, T39) back to the gate node of the new first stage (T23, T33). OP4 is closed to connect the drains of T24, T34 to the gate node G1 and OP5 is closed and OP6 is opened to connect the sources of the additional n-devices to the Bus connected to the drain of T42. When the foregoing oscillator is increased to seven stages, the duty cycle is decreased from approximately 20% to approximately 15%. This mode of duty cycle change preserves the basic stability of the oscillator without affecting the thresholding operation. The foregoing option is available by forming the devices required for sevenstage operation, and then using a different metal mask according to whether 5 or 7 active stages are desired.

Figure 2:
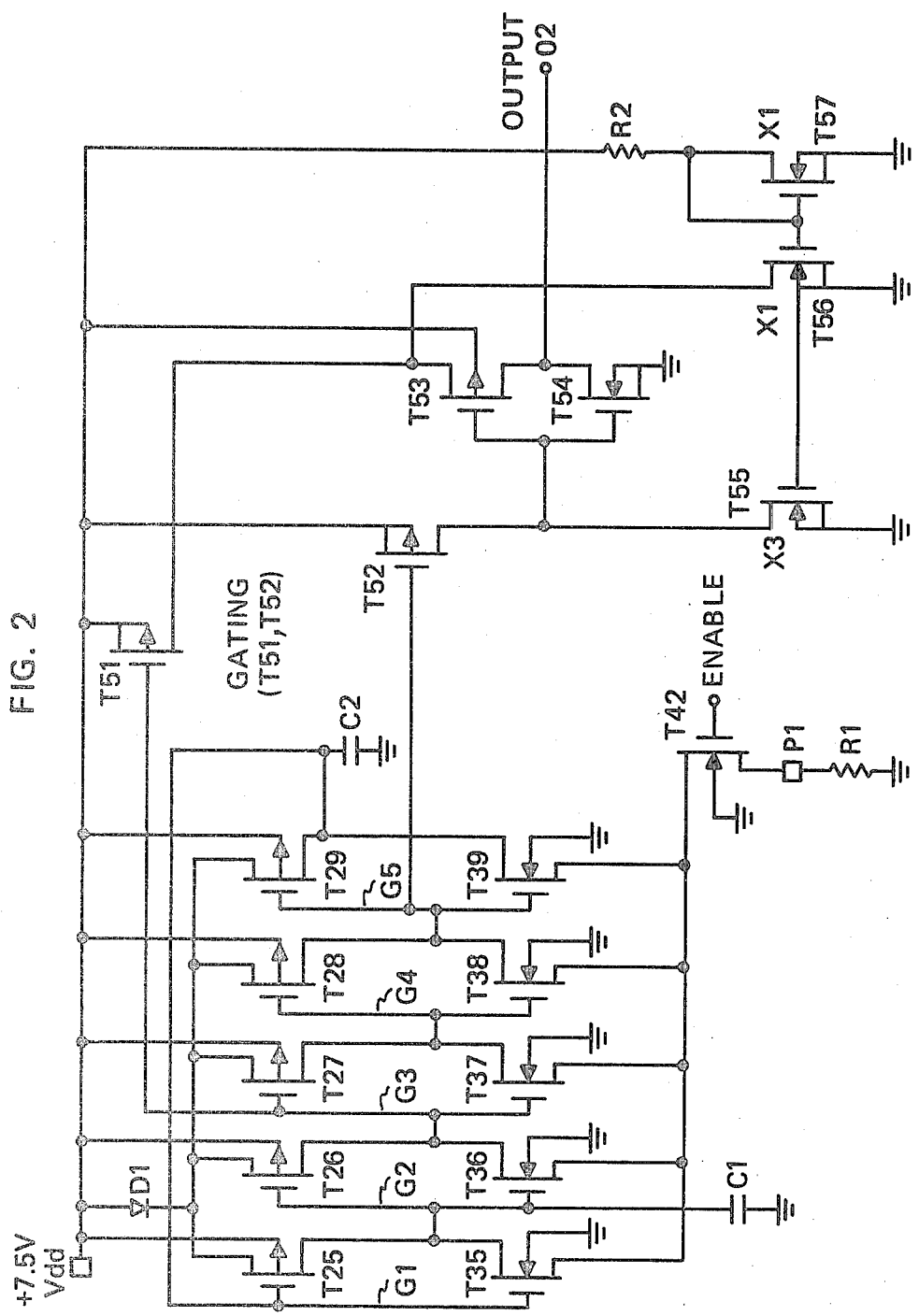
FIG. 2 is an electrical circuit diagram of a second embodiment of the novel pulse generator.

FIG. 2 illustrates a second embodiment of the invention in which changes are made in the ring oscillator and in the manner of deriving a gating signal from it. External to the ring oscillator, the gating is derived from two non-adjacent stages (nodes G3, G5) in the ring oscillator and the gating output is applied to two gates of two separate amplifier stages (T51, T52), the output of which is applied to a two transistor CMOS buffer (T53, T54). The output circuitry is completed by current sinks T55, T56, T57 associated with T51 and T52. Alternatively, two long channel devices of appropriate geometry may be used for the "pull down" function eliminating R2 and T57.

Within the ring oscillator two changes have been made. In the first change, two capacitances C1, C2 are added, which compensate for undesirable timing effects attributable to the ring oscillator output connections. In the second change, the source bus of the ring oscillator is disconnected from the Vdd bus, and connected via diode D1 to the Vdd bus. This last circuit change increases the bias on the gates of output amplifiers T51 and T52, which adds to the oscillator signal in turning on the output amplifiers more strongly. The diode P1 is derived using a connection to a "P well" which is normally used in fabricating n-channel devices in CMOS IC technology.

Prior to further functional description of the FIG. 2 embodiment, the circuit will now be described more particularly. The ring oscillator, which includes devices T25 to T29 and T35 to T39, is as in the first embodiment, except for the introduction of the stray capacity C1 at the gate node G2, and the stray capacity C2 at the gate node G1; and the previously noted change in the connection of the p-channel source bus. The capacities C1 and C2 are added at two gates not used for deriving an output. Such added capacity is common in the layout of the integrated circuit as an incident to crossovers in the interconnection network. The added capacity attributable to the output connections at nodes G3 and G5 tends to widen the 20% duty cycle, and the two small capacities are selected to correct the effect upon the duty cycle, while lowering the frequency of the oscillator. The frequency can then be elevated to the desired value by adjustment of the external resistance R1.

In the other change, the source of the p-channel devices (T25-T29) in the FIG. 2 embodiment are connected to the cathode of the diode D1, whose anode is connected to the Vdd bus. This produces an approximately 0.4 volts reduction in voltage applied to the ring oscillator stages, which may be compensated by choosing a reduced value of R1. The primary effect of the change is to permit direct output drain to input gate connection for the amplifier states T51, T52 while establishing a non-zero value for the gate-source of T51, T52.

The first output amplifier stage uses a p-channel device T51 of 100/10 size, having its source and drain connected to the Vdd bus, and its drain connected to the current sink (T56). The gate of T51 is connected to the gate node G3 of the ring oscillator. The current sink uses an n-channel device T56 of 10/10 geometry, the source and substrate of which are connected to ground and the drain of which is connected to the drain of T51. The current of T56 is controlled by diode connected n-channel device T57 of 10/10 geometry, the substrate and source of which are connected to ground, and the gate of which is connected to the drain. The gate-drain connection is connected through a low conductivity FET R2 of 200 Kohms to Vdd. The gate-drain of T57 is connected to the gate of T56 and establishes the current setting of the current sinks.

The other amplifier stage utilizes a p-channel device T52 of 100/10 size, having its source and substrate connected to the Vdd Bus, and its drain connected to the current sink T55. The gate of T52 is connected to the gate node G5 of the ring oscillator. The current sink uses an n-channel device (T55) of 20/10 geometry having source and substrate connected to ground, and the drain connected to the drain of T52. The current of the current sink is controlled by T57 via the connection of the gate of T55 to the gate-drain of T56.

The outputs of the amplifiers T51, T52 appear at the drains thereof and are coupled to the output buffer stage which includes the p-channel device T53 and the n-channel device T54. The source of T53 is connected to the drain of T51 for application of the first output from the ring oscillator. The substrate of T53 is connected to the drain of T54. The buffer output appears at the drain inter-connection. The substrate and source of T54 are connected to ground. The gates of T53 and T54 are connected together and the second output from the ring oscillator, derived from the drain of T52, is coupled to these gates.

The circuit operation, as earlier noted, provides minimum loading to the ring oscillator since the output is coupled to the gates of the output amplifiers T51, T52. (The oscillator devices T25-T29, T35-T39 are typically 100/10 devices). The current set into current sinks T55 and T56 provides a discharge path for charge stored in the capacity of the drains of T51, T52 and gates of T53, T54. Therefore, the current setting of T57, which controls that of T55, T56 will establish the maximum frequency of proper operation. The 30 μa settings provided will establish a frequency maximum of approximately 200 Khz.

As earlier noted, the 0.4 volts drop in voltage of the sources of the p-channel devices (T25-T29) below the Vdd Bus allows an equal increase in the drive voltage available to the output amplifiers (T51, T52) allowing them to be turned on more strongly by the signal coupled from the ring oscillator. In a suitable setting for this embodiment, the voltage swing on the gate nodes is approximately 2 volts corresponding to a lower Vdd. Since the gate of T53 (and T54) is at ground (T52 being nonconductive) a high output near Vdd is initiated at output 02. When the falling voltage on node G5 turns on T52, T53 is turned off by the application of Vdd to its gate, and T54 is turned on by the same application of Vdd to its gate. The conduction of T54 terminates the high output state at the output 02, and returns it sharply to ground.

The dynamic pull-down of T54 insures a nearly perpendicular slope on the trailing edge of the output waveform, and the high gain of the amplifier, provides a nearly perpendicular leading edge to the output waveform. In many applications output buffering may not be necessary. Where necessary, one may add a hysteresis output stage (as shown in FIG. 1(b)), or other buffering means.

The two sampling paths of the foregoing arrangement, T51, T52 are designed to achieve a 20% duty cycle with equal time delays at the beginning and ending of the output pulse. The 20% duty cycle is fixed by sampling the voltage at the gate nodes G3 and G5 of a five-stage ring oscillator. In the arrangement, one transversal of the five stages produces 180° in the incident wavefrom, two transversals of the ring or ten stages produce 360°, with one stage producing 36° or 10% delay. Accordingly, to get a 20% duty cycle, with samples of similar portions of the travelling waveform, the samples must be taken two stages apart (2=10%×22%).

The FIG. 2 arrangement is designed to switch on the falling waveform portion of the G3 and G5 waveforms. In the waveforms of FIG. 3(a) (which are representations of the first embodiment and therefore neither precisely accurate in waveshape nor amplitude), the turn on instant of T51 is about 1.0 volt down from the maximum value on the downward slope of the G3 near $T_o$. The turn on instant of T52 is also about 1.0 volts down from the maximum on the G5 waveform near to $+2\mu s$ on the illustrated waveform. In the FIG. 2 embodiment, the turn-on and turn-off instants of the output pulse at 02 are approximately $2\mu$ seconds apart (with a pulse repetition rate of $10\mu$ seconds). The downward slopes of the waveforms at the G3 and G5 nodes in the FIG. 2 embodiment will differ from those illustrated in FIG. 3(a). This is due to differences in layout and/or added effects and to differences in loading by the output amplifiers T51, T52.

Proper operation of the output stages requires current sinking to discharge the capacity at the output of the amplifier T51, T52 and input to buffer T53, T54. The capacity on the T52 output node is greater than the capacity on the T51 output node and therefore T55 is made larger in geometry than T56. Failure to completely discharge these nodes will result in waveform deformation or even malfunction. The sink T55 is designed to pull down the source capacity of T52 and the gate capacities of T53, T54 while T56 is required to discharge only the source capacity of T51. The three to one size selection is appropriate under these circumstances.

The FETs comprising the ring oscillators of the two illustrated embodiments are normally larger than those conventionally used for digital circuits. This is desirable to obtain greater "gain" for these devices to sustain oscillation in the presence of loading. In a breadboard of the FIG. 1 embodiment, the devices in the oscillator had a width to length ratio of approximately 1000/10. T40 is a "long channel" device, typically 10/100 W/L. T31 and T41 may be 10/10 devices. T30 may be a 100/10 device. In the FIG. 2 embodiment, the devices T25-T29 and T35-T39 are reduced in size to 100/10, and the current sinks, T55, T56 and T57 are respectively 30/10/ 10/10 and 10/10. Devices T51 and T52 are 100/10 and output devices T53, T54 are 10/10. The low conductance FET acting as R2 is a long channel device of 10/100 geometry.

In each of the stages of the ring oscillator, the substrates of the n-devices are connected to ground while the sources of the n-devices are connected through a series resistance (R1) and the n-device (T42) to ground. Thus, the sources of the n-devices are maintained at a substantial (e.g., 3 V) positive potential with respect to substrate. The turn-on threshold of an FET is a function of both the gate to source voltage and gate to substrate voltage. If the source is at a potential greater than the substrate, the turn-on threshold of the device will increase. This increase in threshold is the "body effect".

One effect of increasing the gating threshold is to reduce the amount of joint conduction with the associated P-device and thus the current drain in the ring oscillator is reduced. A more positive turn-off of the n-devices is also produced. The reduction in current in devices in the ring is not of great consequence since the current there is small (30 $\mu$A at 100 Khz) in relation to the current drain (typically 100 $\mu$A) of the inverter stage.

The body effect configuration produces a greater voltage swing. Assuming a ring oscillator that is otherwise the same, but having no body effect due to connecting the substrate to the source, the voltage swing on the ring oscillator is about 2 V versus the 5 V swing with body effect. Both variations of the design require that the serial resistance (R1) be chosen to discharge the gates in the ring to the switching threshold in a certain time period to establish the frequency. Assuming that the selected frequency is 100 Khz, the configuration with the body effect requires an R1 of 110K while the configuration without body effect requires an R1 of 330K.

One consequence of the need for a large resistance for R1 in the non-body effect configuration is to cause a substantial diminution of the output signal deliverable to the oscillator load (i.e., T40). At the load, the body effect configuration has approximately four times (7.5 V) the output voltage approximately (2 V) of the non-body effect configuration. To increase the output voltage in the non-body effect configuration, the conductance of T40 is normally reduced by a factor of two so that the output voltage (approximately 4 V) of the non-body effect configuration may be increased to ½ that of the body effect configuration. When the signal (D6) appearing at the output of the gating circuit, is coupled to the buffer (T31, T41), a smaller conductance for T40 forces the fall time of the D6 waveform to be much longer than when the conductance is higher. The effect of a more gradual switching waveform at D6 is to cause greater current drain from the buffer (T31, T41). A current increase here is more significant than in the oscillator because of the higher current level (100 μA) of the buffer, thus suggesting a Schmitt Buffer is preferred.

Experience has shown that the body effect configuration has a greater temperature margin before significant duty cycle variation than the non-body effect configuration. In other words, the body effect configuration, which produces greater available power for deriving a useful switching waveform for a given current drain and a given supply voltage, permits a more temperature stable duty cycle using a given output stage (e.g., T31, T41), and is therefore to be preferred.

While the principal embodiments have used either a 5 or a 7-stage ring oscillator, one may use larger numbers of stages (e.g., 9, 11, 13, 15, etc.) to reduce the natural frequency of the oscillator or to change the duty cycle.

The first embodiment has also confined itself to a configuration in which the gating stage is connected for response to adjacent stages. The first embodiment, without other modification may operate with the gating input connected to stages 3 to 5, or 5 and 7. The natural duty cycle in such circumstances is smaller.

The second embodiment, may be connected for response to non-adjacent stages having the same phase, the 3-5 connections being appropriate for a 20% duty cycle. Here also the number of stages, and the interval between stages may take other values if other duty cycles are desired (e.g., 3, 7 if "m" is suitably large, etc.)

If a duty cycle larger than 20-30% is desired, the waveform may be inverted. If a duty cycle closer to 50% is sought in the FIG. 1 embodiment, the parameters treated in FIGS. 4, 5 and 6 may be adjusted. In general, the invention does not seek to solve the 50% duty cycle problem, because it may be directly obtained from the natural oscillator waveform.

In the second embodiment, the waveform supplied to the two buffer amplifiers T51, T52 are completely symmetrical with each receiving exactly the same waveform but delayed in time by the amount of the desired output pulse width. Any analog perturbation such as voltage or current or temperature effects both equally as far as time delay is concerned. As a result the pulse width tends to be constant i.e., 20%, almost independent of other variables. This contrasts to the first embodiment where the two taps on the ring oscillator are adjacent and thus 10% in time delay but waveform differences at the two taps (one positive going, one negative going) result in a 20% actual duty cycle.

What is claimed is:
1. A pulse generator for integrated circuit fabrication of predetermined frequency and producing an output pulse having a desired duty cycle, comprising:
   (a) a positive terminal for connection to a source of positive bias potentials; and a common terminal;
   (b) a ring oscillator comprising an odd number (m) of complementary metal oxide semiconductor (CMOS) field effect transistor inverter stages,
      (i) each stage including a p-channel device, having the source thereof conductively connected to said positive terminal, and an n-channel device having the drain thereof connected to the drain of the associated p-channel device, the drain connection forming an output of that stage,
      (ii) the gates of the p- and n-channel devices of each stage being connected together, the gate node forming an input of that stage,
      (iii) the input of each stage being connected to the output of a preceeding stage to form a ring;
   (c) the sources of said n-channel devices being connected together; and a resistance of a preselected value connecting said source connection to said common terminal, the resistance value determining the oscillator frequency, and
   (d) gating means responsive to electrical conditions in at least two stages of said ring oscillator for generating an output pulse having said desired duty cycle.

2. A pulse generator as set forth in claim 1 wherein said gating means (d)
   (i) has at least one threshold, initiating an output pulse when an input crosses a threshold value in one sense and terminating an output pulse, when an input crosses a threshold value in the opposite sense.

3. A pulse generator as set forth in claim 1 wherein said gating means (d)
   is responsive to the difference between a first voltage at the gate of the (i)th inverter stage and a second voltage at the gate of the (j)th inverter stage, a change in the first voltage, while the second gate voltage is substantially constant, establishing one limit of said output pulse, and a change in the second voltage while the first voltage is substantially constant establishing the other limit of said output pulse.

4. A pulse generator as set forth in claim 3 wherein "i" and "j" represent adjacent inverter stages, listed in succession.

5. A pulse generator as set forth in claim 4, wherein said gating means (d) comprises a CMOS stage including a p-channel device and a n-channel device current sink,
   (i) the gating p-channel device having the drain thereof connected to the drain of said current sink device, and the source of said current sink device being connected to ground, and the gate of said current sink device being connected to said positive terminal,
   (ii) the source of said gating p-channel device being connected to the gate of the (i)th, inverter stage, and the gate of said gating p-channel device being connected to the gate of the (j)th inverter stage;
   (iii) the gating output being taken from said drain interconnection.

6. A pulse generator as set forth in claim 5, having in addition thereto:
   (e) a buffer comprising a CMOS stage including a p-channel device and an n-channel device
      (i) the source and substrate of said p-channel device being connected to said positive terminal,
      (ii) the source and substrate of said n-channel device being connected to said common terminal,
      (iii) the gates of said buffer devices being connected together, and the drains of said buffer devices being connected together, and
      (iv) means coupling the output of said gating means to said gate interconnection, the output of said pulse generator being taken from said drain interconnection.

7. A pulse generator as set forth in claim 5, having in addition thereto:
   (e) a buffer comprising a hysteresis gate; having the input thereof connected to the drain interconnection of said gating means, and the output of said pulse generator being taken from the output of said hysteresis gate.

8. A pulse generator as set forth in claim 1 wherein:
(e) means are provided for enabling said oscillator comprising an n-channel device inserted in a series path between the sources of said oscillator n-channel devices and said resistance, said n-channel enabling device having the drain thereof connected to the sources of said n-channel devices, the source thereof connected to said resistance means, and the gate thereof connected to a source of control potentials.

9. A pulse generator as set forth in claim 1 wherein the substrates of all said n-channel devices in said ring oscillator are connected to ground to provide a body effect which increases the voltage swing on the output-input connections of said ring oscillator.

10. A pulse generator as set forth in claim 1 wherein: the ring oscillator is fabricated in an integrated circuit, and said resistance is external thereto, to permit oscillator frequency selection after fabrication of the integrated circuit by selection of the value of said resistance.

11. A pulse generator as set forth in claim 10 wherein: the integrated circuit is provided with optional additional stages to the ring oscillator to permit duty cycle variation after diffusion of the devices on the IC by use of one of at least two optional metallizations; each metallization connecting the selected number of stages into the ring oscillator circuit and disconnecting and disabling the unused stages.

12. A pulse generator as set forth in claim 1 wherein: said gating means
(d) includes a first and a second threshold amplifier, one connected to the gate of the (i)th inverter stage, and initiating an output pulse when the signal at the (i)th gate crosses a threshold value; and the other connected to the gate of the (j)th inverter stage, and terminating an output pulse, when the signal at the (j)th gate crosses a threshold value.

13. A pulse generator as set forth in claim 12 wherein "i" and "j" are listed in sucession, j representing the (i+2n)th stage of the m stage ring oscillator, n being an integer permitted within the total stage count m.

14. A pulse generator as set forth in claim 13, wherein each threshold amplifier
(d) comprises a p-channel device and a n-channel device current sink:
(i) the gate of said p-channel device being connected to the gate node of the appropriate (ith,jth) inverter stage;
(ii) the p-channel device having the drain thereof connected to the drain of said n-channel device, and the source of said n-channel device being connected to ground,
(iii) the gating output of each threshold amplifier being taken from said drain interconnection.

15. A pulse generator as set forth in claim 14 wherein the conductive connection of the sources of the p-channel devices of the inverter stages in said positive terminal, is a diode and wherein:
the sources of the threshold p-channel devices are connected to said positive terminal, to increase the gate to source potentials of said threshold amplifiers and enhance the level of conduction thereof for a given oscillator electrical condition.

16. A pulse generator as set forth in claim 15 wherein:
(e) an output stage as provided comprising a p-channel device and an n-channel device,
(i) the source of the output p-channel device being connected to the drain of the threshold p-channel device coupled to the (i)th inverter stage,
(ii) the gates of the output p-channel and n-channel devices being connected to the drain of the threshold p-channel device coupled to the (j)th inverter stage,
(iii) the source of the output n-channel devices being connected to said common terminal,
(iv) the drains of the output p-channel and n-channel devices being connected together and providing a substantially rectangular output pulse.

* * * * *